United States Patent
Li et al.

(10) Patent No.: US 12,374,984 B2
(45) Date of Patent: Jul. 29, 2025

(54) ROBUST LOW POWER STANDBY CONTROLLER FOR WEARABLE AND HEALTHCARE SUPPLY MODULES

(71) Applicant: Avago Technologies International Sales Pte. Limited, Singapore (SG)

(72) Inventors: Shengyuan Li, Irvine, CA (US); Xicheng Jiang, Irvine, CA (US); Kareem Abdelghani Ibraheem Mohamed Ragab, Irvine, CA (US); Zen Wu, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 358 days.

(21) Appl. No.: 18/112,399

(22) Filed: Feb. 21, 2023

(65) Prior Publication Data
US 2024/0283349 A1    Aug. 22, 2024

(51) Int. Cl.
*H02M 3/155*     (2006.01)
*H02M 1/00*      (2006.01)
*H03K 3/037*     (2006.01)
*H03K 19/20*     (2006.01)

(52) U.S. Cl.
CPC ......... *H02M 1/0032* (2021.05); *H02M 3/155* (2013.01); *H03K 3/037* (2013.01); *H03K 19/20* (2013.01)

(58) Field of Classification Search
CPC .... H02M 1/0032; H02M 3/155; H03K 3/037; H03K 19/20
See application file for complete search history.

(56) References Cited

U.S. PATENT DOCUMENTS

| | | | | |
|---|---|---|---|---|
| 7,482,791 | B2* | 1/2009 | Stoichita | H02M 3/156 |
| | | | | 323/288 |
| 11,147,132 | B2* | 10/2021 | Huang | H05B 45/10 |
| 2008/0088292 | A1 | 4/2008 | Stoichita et al. | |
| 2011/0089925 | A1 | 4/2011 | Ishida et al. | |
| 2011/0215786 | A1 | 9/2011 | Ishii et al. | |
| 2012/0161738 | A1* | 6/2012 | Nakashima | H02M 3/158 |
| | | | | 323/284 |
| 2020/0310475 | A1 | 10/2020 | Wang et al. | |

OTHER PUBLICATIONS

European Search Report on non-Foley case related to U.S. Appl. No. 18/112,399 dtd Jul. 22, 2024.

* cited by examiner

*Primary Examiner* — Adolf D Berhane
(74) *Attorney, Agent, or Firm* — Foley & Lardner LLP

(57) ABSTRACT

A controller includes a first circuit that receives first and second input signals and generates an output pulse based on the first and second input signals. A timer circuit of the controller generates the first input signal for the first circuit. A second circuit of the controller generates the second input signal for the first circuit. In response to the second input signal being set to a first value, smaller than a second value, the first circuit sets the output pulse to the second value and start a first duration. In response to the second input signal being set to the second value and the first input signal changing from the first value to the second value, the first circuit sets the output pulse to the first value to end the first duration and start a second duration such that the second duration is maintained more than a time limit.

20 Claims, 7 Drawing Sheets

ROBUST LOW POWER STANDBY CONTROLLER FOR WEARABLE AND HEALTHCARE SUPPLY MODULES

TECHNICAL FIELD

The present description relates generally to power supplies and, in particular, related to controllers of power supplies at standby mode.

BACKGROUND

A switching-mode power supply (SMPS) may operate in active-mode and standby mode. In standby mode, there is no load or a very small load is present but the SMPS maintains the output voltage. Since there is no load or a very small load, a standby-mode controller may need to have very low power usage, as SMPS can stay in standby mode for long durations of the time while the system is on. The standby-mode controller may also need to be robust with high reliability.

BRIEF DESCRIPTION OF THE DRAWINGS

Certain features of the subject technology are set forth in the appended claims. However, for purposes of explanation, several aspects of the subject technology are depicted in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

An active-mode controller of a switching-mode power supply (SMPS) with high power dynamic range is needed when the active-mode controller is also used in a standby-mode. The controller may become a low efficiency controller and the power supply may generate apparent high switching noise during standby mode. During a standby operation of the SMPS, the power usage of the controller is reduced. In the standby mode, the load current does not exist or the load current is minimal, e.g., less than 100 micro Amperes (uA), because many of the modules that are not needed are shut down and only a few modules are running. Thus, using a separate controller for the standby mode helps reduce nose and the power usage and conserve battery. In addition, the current rating of the SMPS is maintained to avoid any damage by excess current.

Figure 1:
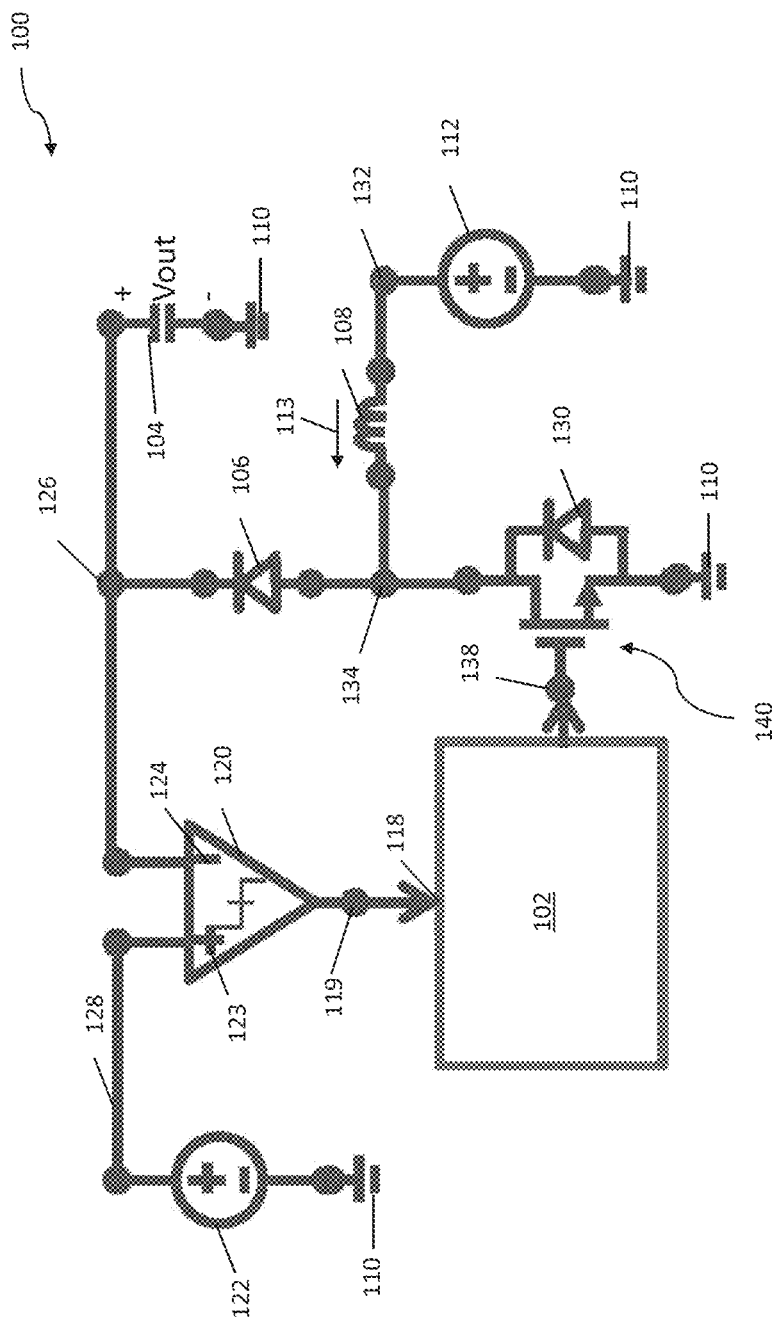
FIG. 1 illustrate a switching-mode power supply and a controller of the switching-mode power supply.

FIG. 1 illustrate a switching-mode power supply 100 and a controller 102 of the switching-mode power supply. As shown an input voltage source 112 is connected between a ground 110 and a first node 132 of an inductor 108. An output voltage source Vout is generated over an output capacitor 104 that is connected between a node 126 and the ground 110. Another end of the inductor is connected to a node 134 that is also connected to a source of a transistor 140, e.g., a source node of the transistor 140. A drain of the transistor 140, e.g., a drain node of the transistor 140, is connected to the ground 110. A diode 130 is connected between the source and drain of the transistor 140 such that the anode of the diode 130 is connected to the drain of the transistor 140 and the ground 110. Another diode 106 is connected between the nodes 134 and 126 such that the anode of the diode 106 is connected to the node 134. In some embodiments, the output capacitor 104 is periodically charged and discharged and the output voltage Vout has a periodic ripple.

A controller 102 is connected from an output node 138 of the controller 102 to a gate of the transistor 140, e.g., a gate node of the transistor 140. When a positive pulse is applied by the controller 102 to the gate of the transistor 140, the transistor 140 turns on a current flows from the input voltage source 112, through the inductor 108 and through the transistor 140 to the ground 110. Thus, the positive pulse applied by the controller 102 causes current build up in the inductor 108. Then, the applied positive pulse to the gate of the transistor 140 becomes zero and the transistor 140 does not allow a passage of the current. Now the current of the inductor goes through diode 106 to the output capacitor 104 to generate the output voltage source Vout. In some embodiments, the diode 106 prevents a capacitor discharge of the output capacitor 104.

In some embodiments, the process of applying positive voltage to the gate of the transistor is followed by applying a zero or negative voltage to the gate of the transistor 140 is repeated and charging the output capacitor 104 continues. In some embodiments, a limit is applied to a duration of time of applying the positive pulse, e.g., the on-time or duration $T_{on}$, to the gate of the transistor such that a current 113 in the inductor 108 does not go over the current ratings. In addition, a limit is applied to a time of applying zero or negative voltage, e.g., a minimum or a lower limit of the duration $T_{off}$, such that the inductor is completely depleted of the current, which also prevents current build up in the inductor 108 that may cause the inductor current go over the current ratings of the inductor 108. Because the duration $T_{off}$ is maintained more than a predetermined time limit, the switching frequency of the transistor 140 is limited by a lower limit of the duration $T_{off}$ and, thus, causes an upper limit for the switching frequency. Thus, the switching frequency may not exceed a limit and the inductor 108 does not require over-current protection to prevent the over-current in the inductor 108 such that the switching frequency is maintained below a predetermined frequency limit. Thus, during standby mode, the over-current protection may be turned off to conserve power. In some embodiments, the maximum switching frequency is 250 kHz, e.g., a predetermined maximum frequency limit, and the lower limit of the duration $T_{off}$ is about 4 microseconds, e.g., a predetermined lower limit. In some embodiments, the maximum switching frequency is 125 kHz and the lower limit of the off-time is about 8 microseconds.

FIG. 1 also shows a comparator 120 and a reference voltage source 122 that is connected between a node 128 and the ground 110. The node 128 is connected to a non-inverting input node 123 of the comparator 120. In addition, the node 126 that is connected to the output capacitor 104 is also connected to the inverting input node 124 of the comparator 120. Thus, the comparator 120 includes the non-inverting input node 123 and the inverting input node 124. In some embodiments, the comparator 120 determines a voltage difference between two voltages, the reference voltage source 122 and the output voltage source Vout. The voltage difference is provided as an output signal of the comparator 120 at an output node 119 of the comparator 120. The output node 119 is connected to an input node 118, a comparison input node, e.g., a comparison node or a COMP input node, of the controller 102. In some embodiments, the output signal provided at the output node 119 of the comparator 120 has a logical value. When the voltage Vout at the inverting input node 124 is smaller than a voltage value of the reference voltage source 122 at the non-inverting input node 123, the output node 119 of the comparator 120 is set to a logical one. Also, when the voltage Vout at the inverting input node 124 is larger than or equal to the voltage value of the reference voltage source 122 at the non-inverting input node 123, the output node 119 of the comparator 120 is set to a logical zero. Thus, the logical value at the output node 119 of the comparator 120 is set to the logical one or the logical zero based on a difference between Vout and the voltage value of the reference voltage source 122. Then, the controller 102 determines a pulse with modulation signal at the output node 138 of the controller 102 that causes the transistor 140 to turn on and off. In some embodiments, the comparison signal is an indication of a comparison of two voltages coupled to two input nodes 123 and 124 of the comparator 120. The controller is discussed below with respect to FIGS. 2A, 2B, 2C, and 2D and also FIGS. 3A, 3B, 3C, and 3D.

Figure 2A:
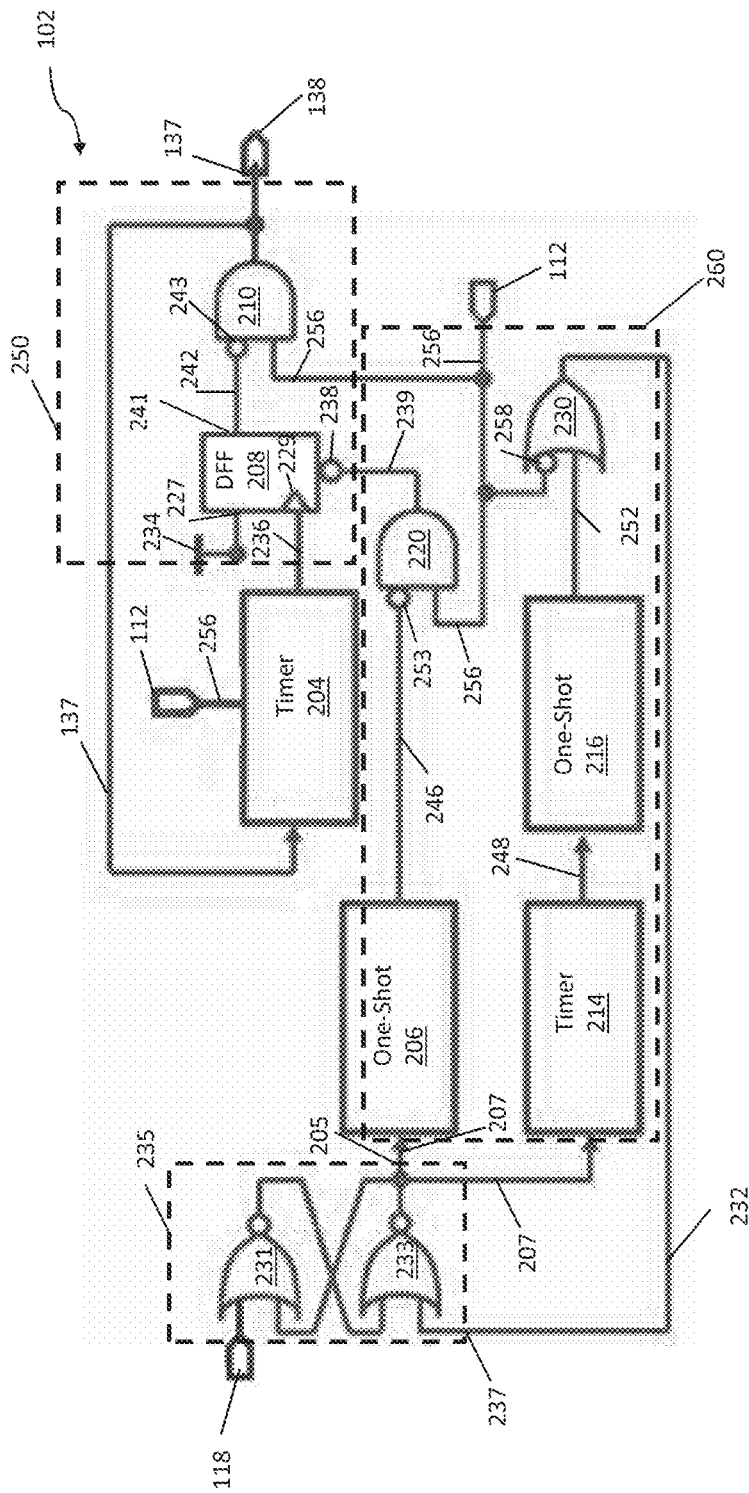
FIGS. 2A, 2B, 2C, and 2D illustrate a controller of the switching-mode power supply, an output signal at an output node of the controller, a clock signal, and a reset signal, according to various aspects of the subject technology.

FIGS. 2A, 2B, 2C, and 2D illustrate a controller 102 of the switching-mode power supply 100, an output pulse 137, e.g., a controller output pulse, at an output node 138 of the controller, a clock signal 236, and a reset signal 239, according to various aspects of the subject technology. FIG. 2A shows the controller 102 that includes an output circuit 250, e.g., a first circuit, an interface circuit 260, e.g., a second circuit, and an input circuit 235, e.g., a third circuit. The input circuit 235 includes first and second NOR gates 231 and 233 with an output node of each NOR gate coupled to a first input node of the other NOR gate. An output node 119 of the comparator 120 is coupled to a second input node of the first NOR gate 231, which is the input node 118 of the controller 102. A turn-off signal 232 from the interface circuit 260 of the controller 102, that when being set to the HV, the $T_{off}$ may begin, is coupled to an input node 237 of the controller 102, which is a second input node of the second NOR gate 233. Also, the input circuit 235 has an output node 205, which is the output node of the second NOR gate 233 and provides a selection signal 207. In the input circuit 235, when the input node 237 is set to the HV, e.g., is put to the HV, the selection signal 207 of the output node 205 is set to the LV, regardless of what value the input node 118 is set. When the input node 118 is set to the HV and the input node 237 is not set to the HV, the selection signal 207 of the output node 205 is set to the HV. In some embodiments, the output pulse 137 is periodic, e.g., the output pulse 137 is a periodic controller output pulse. In some embodiments, the interface circuit 260, the timer 204, and the input circuit 235 are combined into a single circuit.

FIG. 2A shows the output circuit 250 of the controller 102. The output circuit 250 includes a D flip flop, e.g., a DFF 208, and an AND gate 210. As shown, the DFF 208 receives an input signal 234 at an input node 227, a clock signal 236 at a clock port 229 (Clk), and a reset signal 239 at a reset node 238. Also, an output signal 242 is provided at an output node 241 of the DFF 208. In some embodiments, the input signal 234 is set to a high value (HV), e.g., a second value greater than the first value, or a logical one. In some embodiments, when the reset signal 239 is set to a low value (LV), e.g., a first value or a logical zero, regardless of what the input signal 234 is, the output signal 242 at the output node 241 goes to the LV. In some embodiments, the LV on the reset node 238 is applied asynchronously and does not need the clock signal 236 to trigger the change, e.g., to cause the change, of the output signal 242. In addition, the AND gate 210 of the output circuit 250 receives an input voltage 256, e.g., an HV, from the input voltage source 112 at a first input node of the AND gate 210. Also, the output signal 242 of the DFF 208, after being inverted, is applied to a second input node 243 of the AND gate 210. The output pulse 137 is provided to the output node 138 by the AND gate 210. Therefore, when the reset signal 239 goes to the LV, the output node 241 of the DFF 208 goes to the LV and the HV is applied the second input node of the AND gate 210. Because the first input node of the AND gate 210 is at the HV, the output pulse 137 is set the HV. In some embodiments, the output pulse repeats and is a periodic pulse, e.g., a periodic output pulse, with a period T that equals $T_{on}$ plus $T_{off}$. In some embodiments, the logical zero is zero volts and the logical one is a value greater than zero volts, e.g., around one volt.

Figure 2D:
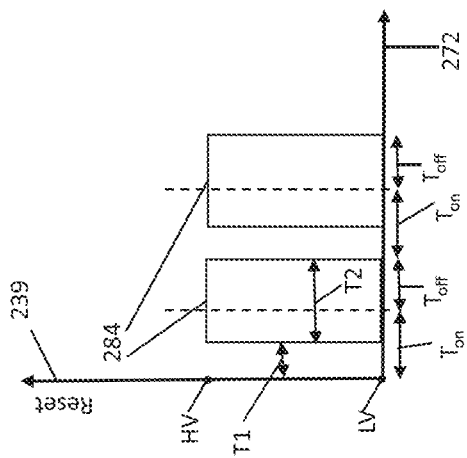

The controller 102 of FIG. 2A also includes a timer 204, e.g., a timer circuit, that provides the clock signal 236 for the DFF 208. The timer 204 is connected to the input voltage source 112 and receives the input voltage 256 and is further connected to the output node 138 and receives the output pulse 137. FIG. 2B shows the output pulse 137 versus time on a time-coordinate 272, which is set at the HV for a duration $T_{on}$ and is set to the LV for an off-time $T_{off}$. The output pulse 137 is a pulse width modulation (PWM) signal that is applied to the gate node of the transistor 140 of FIG. 1. When the output pulse 137 that is applied to the timer 204 goes to the HV, the timer 204 is triggered and the clock signal 236, which is generated as an output signal of the timer 204 goes to the LV and stays at the LV for the duration $T_{on}$. As the result, the output signal 242 of the DFF 208 stays at the LV and the output pulse 137 stays at the HV for the duration $T_{on}$. In some embodiments, the duration $T_{on}$ is inversely proportional to the input voltage 256 but for each input voltage the duration $T_{on}$ is a fixed duration. In some embodiments, the input voltage source 112 is a battery and the input voltage 256 is generated by the battery. The timer 204 expires, e.g., a first timeout period of the timer 204 ends or expires, after the $T_{on}$ and the clock signal 236 goes to the HV, which triggers the DFF 208 and transfers the input signal 234 to the output node 241 and the output signal 242 goes to the HV and the output pulse 137 goes to the LV. In some embodiments, the output signal 242 goes to the HV if the reset signal 239 has already jumped to the HV. The clock signal 236 is described with respect to FIG. 2C.

The controller 102 of FIG. 2A also includes the interface circuit 260 that is connected between the input circuit 235 and the output circuit 250. As shown, the interface circuit 260 includes a one-shot circuit 206, a timer 214, e.g., a timer circuit, which after the timer 214 expires, e.g., a second timeout period of the timer 214 ends or expires, the duration $T_{off}$ may start. Also, the interface circuit 260 includes another one-shot circuit 216, an AND gate 220, and an OR gate 230. The interface circuit 260 receives the selection signal 207 from the input circuit 235 and receives the input voltage 256 from the input voltage source 112. Also, the interface circuit 260 provides the turn-off signal 232 to the second NOR gate 233 of the input circuit 235 and the reset signal 239 to the DFF 208 of the output circuit 250. As shown, the one-shot circuit 206, e.g., generate a pulse at an output based on the input, and the timer 214 receive the selection signal 207. When the selection signal 207 is set to the HV, which happens when the input node 118 is set to the HV and the turn-off signal 232 is set to the LV, the one-shot circuit 206 generates a pulse 246 that stays at the HV as long as the selection signal 207 is set to the HV. The AND gate 220 receives the input voltage 256, e.g., the HV, at one node and the pulse 246 that is at the HV at an inverted second node 253. Thus, the AND gate 220 generates the LV at an output gate of the AND 220 and provides the LV as the reset signal 239 on the reset node 238. As shown in FIG. 2A, the reset node 238 resets the output node 241 of the DFF 208 to the LV when the reset node 238 is at the LV. As described, by resetting the output node 241, the output pulse 137 is set to the HV, when the input voltage 256 is at the HV. Setting the output signal to the HV triggers, e.g., starts, the timer 204.

In addition, the timer 214 receives the selection signal 207, which triggers the timer 214. An output signal 248 of the timer 214 stays at the LV for a duration $T_1$ and then jumps to the HV after the duration $T_1$. The output signal 248 of the timer 214 going to the HV, sets a pulse 252 at the output of the one-shot circuit 216 to the HV. Thus the pulse 252 stays for the duration T1 at the LV, goes after the duration T1 that the timer 214 expires to the HV, lasts at the HV for a duration T2, and at the end of duration T2 returns to the LV. In some embodiments, the end of duration T2 defines the end of the duration $T_{off}$ and the beginning of the duration $T_{on}$ and the pulse 252 may similarly repeat. As shown the OR gate 230 receives the pulse 252 at one node and the input voltage 256 at another node 258. Because the node 258 is inverted, the OR gate 230 receives a LV at the node 258, when the input voltage 256 is at the HV, and also receives the pulse 252. Thus, when the pulse 252 jumps to the HV after the duration $T_{on}$, the OR gate 230 generates the HV at an output node of the OR gate 230 and, thus, the turn-off signal 232 becomes the HV. In some embodiments, the sum of T1 and T2 is the period T.

The turn-off signal 232 being at the HV, the selection signal 207 goes to the LV, which triggers the one-shot circuit 206 and the pulse 246 at the output of the one-shot circuit 206 goes to zero and the reset signal 239 goes to the HV and the DFF 208 exits the reset mode, although the output signal 242 of the DFF 208 and the output pulse 137 does not change until the clock signal 236 triggers the clock port 229 of the DFF 208 after the duration $T_{on}$. In some embodiments, when, e.g., in response to, the comparison signal at the input node 118 is set the HV, the timer 214 starts and the reset signal 239 at the reset node 238 is the LV, which causes the output pulse 137 at the output node 138 to change to the HV, which in turn starts the timer 204. In some embodiments, the second timeout period of the timer 214 ends before the first timeout period of the timer 204 ends and, thus, when the clock signal 236 changes from the LV to the HV, the reset node 238 is at the HV, which causes the output signal 242 of the DFF 208 to change to the HV and the output pulse 137 to change to the LV, e.g., ending the duration $T_{on}$.

Figure 2C:
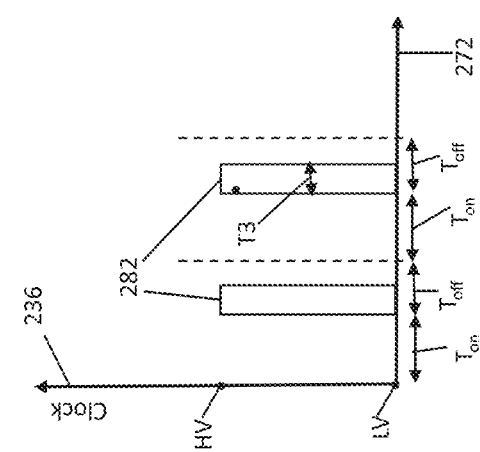
Figure 2B:
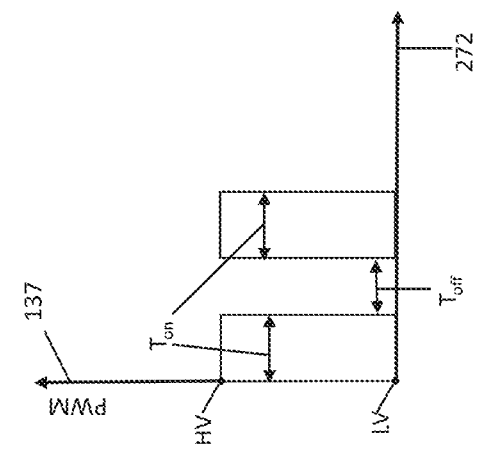

As shown in FIG. 2C, after timer 204 is triggered, the clock signal 236 of the DFF 208 stays at the LV and for the duration $T_{on}$ and then the timer 204 generates a pulse at the HV. As discussed, the clock signal triggering the DFF 208 sends the input signal 234 to the output node 241 and the output signal 242 of the DFF 208 goes to the HV and the output pulse 137 goes to the LV. As shown in FIG. 2C, clock pulses 282 have a duration T3 and return to the LV before the next $T_{off}$. In some embodiments, the clock pulses 282 return to the LV before the next $T_{on}$ expires. Thus, the timer 204 is triggered by the output pulse 137 going to the HV. After the timer 204 expires, the clock signal 236 jumps to the HV. In some embodiments, the timer 204, e.g., the expiration of the timer 204, determines an end of $T_{on}$ and a beginning of $T_{off}$. The output of the timer 204, which is the clock signal 236 stays at the HV for the duration T3.

As shown in FIG. 2D, after timer 214 is triggered, e.g., is started, when the selection signal 207 goes the HV, the output signal 248 of the timer 214 goes to the HV and causes the one-shot circuit 216 to set the turn-off signal 232 to the HV. Thus, sets the selection signal 207 to the LV that changes the pulse 246 at the output of the one-shot circuit 206 to change to the LV and, thus, generate the reset pulses 284 at the HV that brings the DFF 208 out of the reset mode. Therefore, at the next clock pulse 282 of the clock signal 236, the output signal 242 of the DFF 208 goes to the HV. In some embodiments, the widths of the reset pulses 284 and thus a duration that the pulse 252 stays at the HV is less than $T_{on}$. In some embodiments, when the controller 102 is used in FIG. 1, the $T_{off}$ is selected such that the current in the inductor 108 goes to zero. In some embodiments, the timer 214 is triggered when the selection signal 207 goes to the HV. The output signal 248 of the timer 214 stays at the LV for the duration T1 until the timer 214 expires and then the output signal 248 jumps to the HV and stays at the HV for the duration T2. When the output signal 248 is at the LV, the pulse 252, and the turn-off signal 232 are also at the LV and the selection signal 207 stays at the HV, which causes the output pulse 137 to stay at the HV. When the timer 214 expires after the duration T1, the output signal 248, the pulse 252, and the turn-off signal 232 jump to the HV and, thus, the selection signal 207 goes to the LV and the reset node 238 goes to the HV. Then, the DFF 208 is ready to be triggered by the clock signal 236 and start the $T_{off}$. After the duration T2 expires, the reset node 238 goes to the LV, the $T_{off}$ ends and $T_{on}$ starts. Thus, the duration T2 of the timer 214 defines $T_{off}$. In some embodiments, the pulse 246 at the output of the one-shot circuit 206 follows the selection signal 207 at the input of the one-shot circuit 206 and produce a HV pulse at the output node 138 of the AND gate 210 with a pulse width defined by the timer 204. In some embodiments, the pulse 252 at the output of the one-shot circuit 206 follows the output signal 248 at the input of the one-shot circuit 216 and produces a short HV pulse, e.g., the turn-off signal 232, at the output of the OR gate 230 to reset the selection signal 207 of the NOR gate 233 to the LV. In some embodiments, an end of a duration of the short HV pulse at the output of the OR gate 230 determines the end of the duration $T_{off}$. Thus, by increasing the duration of a short HV pulse at the output of the OR gate 230, the duration $T_{off}$ extends and the switching frequency of the output pulse 137 reduces.

Figure 3C:
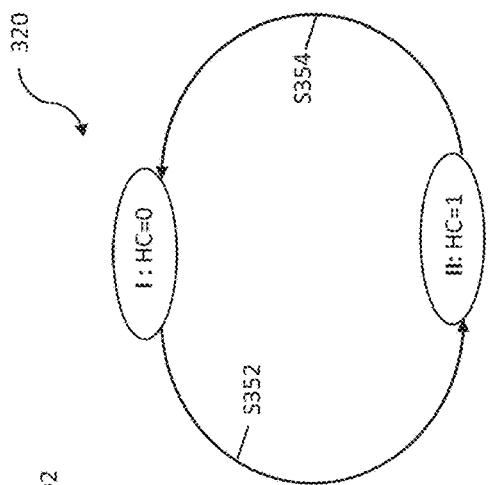
FIGS. 3A, 3B, 3C, and 3D illustrate a controller of the switching-mode power supply, according to various aspects of the subject technology.
Figure 3A:
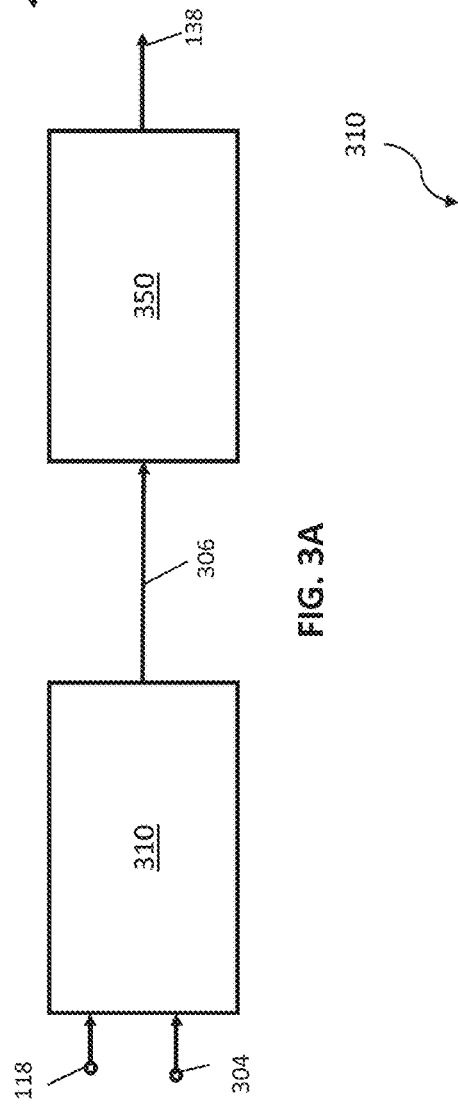
Figure 3B:
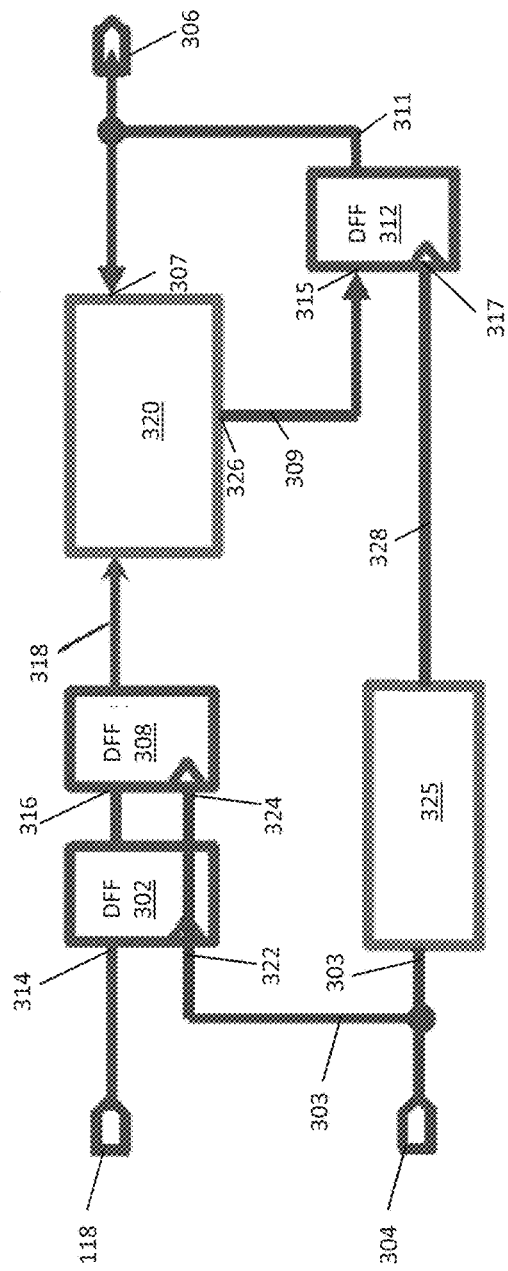

FIGS. 3A, 3B, and 3C illustrate a controller 102 of the switching-mode power supply 100, according to various aspects of the subject technology. FIG. 3A shows that the controller 102 includes an input circuit 310 and an output circuit 350. The input circuit 310 receives a comparison signal, e.g., a comparison voltage, at the input node 118 and a first clock signal 303 at a clock node 304 of the controller 102. The input circuit generates a second clock signal 306 that is transferred via an output node of the input circuit 310 to an input node of the output circuit 350. The output circuit 350 generates the output pulse 137 at the output node 138.

FIG. 3B shows the input circuit 310 that includes DFFs 302 and 308. An input node 314 of the DFF 302 is connected to the input node 118 and receive the comparison signal. The output node of the DFF 302 is connected to an input node 316 of the DFF 308. In addition, the first clock signal 303 is connected to clock nodes 322 and 324 of the DFFs 302 and 308. Thus, the comparison signal is synchronized by the first clock signal 303 and a comparison-synch signal, a CS signal 318, is generated by the DFF 308. The input circuit 310 includes a finite state machine, e.g., an FSM 320, that receives the CS signal 318 and generates a hold-comparison signal, a HC signal 309, at an output node 326 of the FSM 320.

The input circuit 310 of FIG. 3B further includes a divider module 325 that receives the first clock signal 303 from the clock node 304, divides the first clock signal 303 and generates a slower clock, e.g., an intermediate clock signal 328. The input circuit 310 also includes a DFF 312 that receives the HC signal 309 by an input node 315 of the DFF 312. The DFF 312 also receives the intermediate clock signal 328 at a clock node 317 of the DFF 312 and generates an output signal 311, which is the second clock signal 306. As shown, the FSM 320 also receives the second clock signal 306 at an input node 307 of the FSM 320. In some embodiments, the divider module 325 divides generates the intermediate clock signal 328 that has an intermediate frequency that is a predetermined number of times smaller than a first frequency of the first clock signal 303 and the predetermined number is an integer between 2 and 10 and, thus, the predetermined number of times is between twice and 10 times. In some embodiments, a second frequency of the second clock signal 306 is half of the intermediate frequency.

FIG. 3C shows a finite state machine, an FSM 320. In some embodiments, when the FSM 320 is in a state I, e.g., when HC signal 309 is the LV, e.g., the logical zero, the step S352 occurs if the second clock signal 306 is at the LV and if CS signal 318 is at the HV, e.g., a logical one. Then, the FSM 320, goes a state II and the HC signal 309 is set to the HV. In some embodiments, when the FSM 320 is in the state II, e.g., when HC signal 309 is the HV, the step S354 occurs if the second clock signal 306 is at the HV. Then, the FSM 320, goes a state II.

Figure 3D:
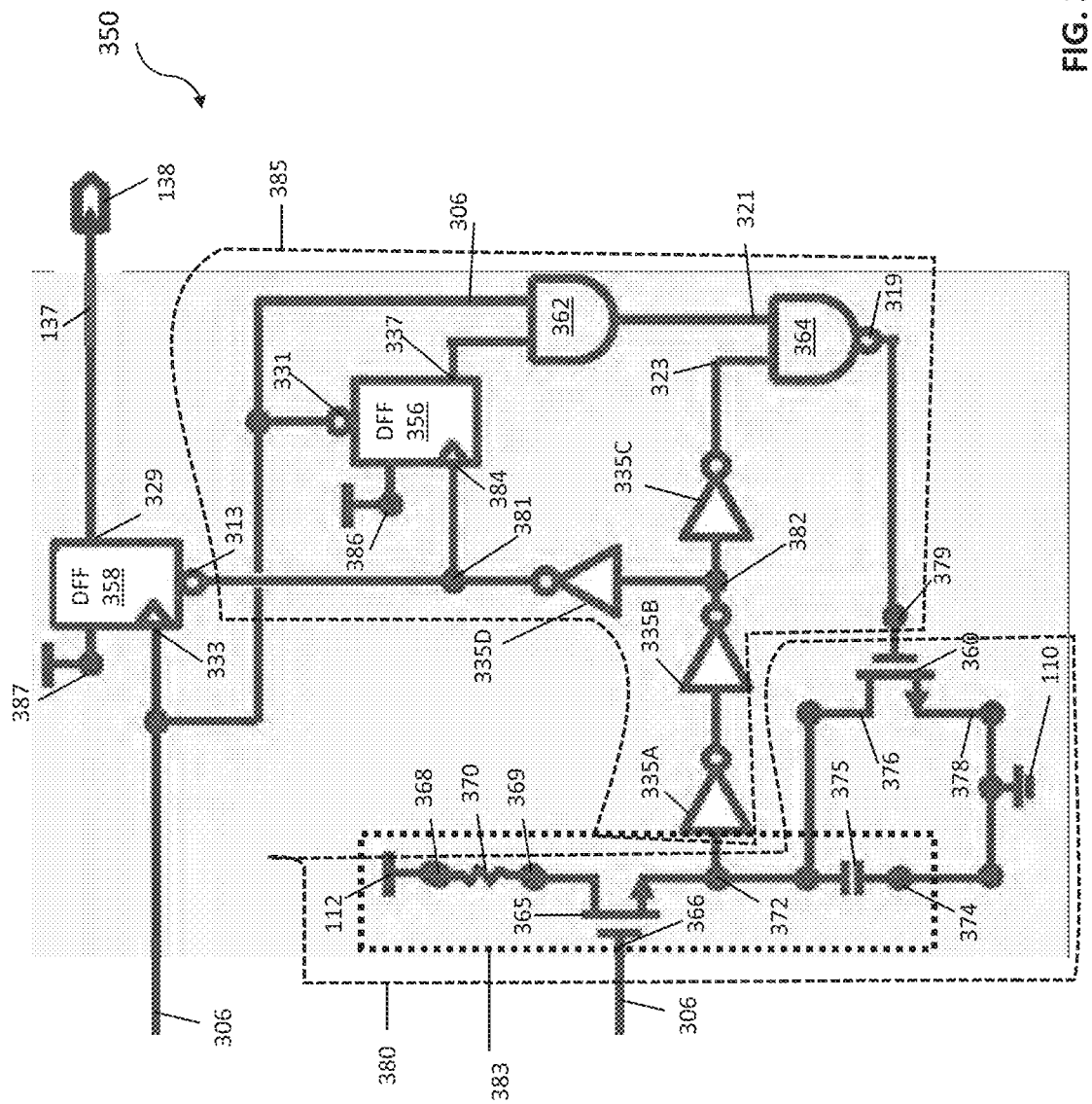

FIG. 3D shows the output circuit 350 that includes a first circuit 380, a second circuit 385, and a DFF 358. The first circuit 380 includes an RC circuit 383 that includes a resistor 370 that is connected from a first node 368 to the input voltage source 112 and from a second node 369 to a drain of a transistor 365. A capacitor 375 is connected from a node 372 to a drain of the transistor 365 and from a second node 374 to the ground 110. A gate of the transistor 365 is connected to the second clock signal 306 produced by the input circuit 310. Thus, when the gate voltage of the transistor 365 is at the HV, the transistor 365 turns on and the capacitor 375 is charged by the input voltage source 112 through the resistor 370 and the transistor 365. When the capacitor 375 is not charged, a voltage of the node 372 is a ground voltage of zero and when the capacitor 375 is charged by the input voltage source 112, the voltage of the node 372 increases. The first circuit 380 also includes another transistor 360 such that the capacitor 375 is connected between a source 376 and a drain 378 of the transistor 360.

In some embodiments, when the capacitor 375 is charged, a voltage is applied to a gate node 379 of the transistor 360 that turns the transistor 360 on. By turning the transistor 360 on, the capacitor is discharged through the transistor 360 and the voltage of the node 372 goes to the gourd voltage. As shown, the DFF 358 receives the second clock signal 306 by a clock node 333. In some embodiments, an input 387 of the DFF 358 is set the logical one and, thus, when the second clock signal 306 jumps from the LV to the HV, the logical one is transferred to the output node 329 of the DFF 358 and the output pulse 137 at the output node 138 goes to the HV. As shown, the DFF 358 includes a reset node 313. When the LV is applied to the reset node 313, the output pulse 137 at the output node 138 goes to the LV. As noted above, the reset node acts asynchronously in some embodiments.

The second circuit 385 includes two cascaded NOT gates 335A and 335B that are connected by an input of the NOT gate 335A to the node 372. An output node of the NOT gate 335B is connected a node 382, which is also connected the gate node 379 of the transistor 360. The second circuit 385 includes a NAND gate 364 and a first input node 323 of the NAND gate 364 is connected through another NOT gate 335C to the node 382 such that an output node of the NOT gate 335C is connected to the first input node 323 of the NAND gate 364. The second circuit 385 further includes a DFF 356. A clock node 384 of the DFF 356 is connected a node 381 and the node 381 is connected through another NOT gate 335D to the node 382 such that an output node of the NOT gate 335D is connected the node 381 and, thus, to the clock node 384 of the DFF 356. The second circuit 385 also includes an AND gate 362. A first node of the AND gate 362 is connected to an inverted output node 337 of the DFF 356 and a second node of the AND gate 362 is connected to the second clock signal 306. In some embodiments, the input node 386 of the DFF 356 is connected to the logical one and a reset node 331 of the DFF 356 is connected to the second clock signal 306 such that when the second clock signal 306 goes the LV, the inverted output node 337 of the DFF 356 goes to the HV. As shown, an output node of the AND gate 362 is connected to a second input node 321 of the NAND gate 364 and an output node 319 of the NAND gate 364 is connected to the gate node 379 of the transistor 360.

As shown in FIG. 3D, when the second clock signal 306 is at the LV, the reset node 331 of the DFF 356 is set to the LV and, thus, the inverted output node 337 of the DFF 356 is set to the HV. The second input node 321 of the NAND gate 364, which is the output node of the AND gate 362 is set to the LV. Thus, the output node 319 of the NAND gate 364 and the gate node 379 of the transistor 360 are set to the HV, which turns the transistor 360 on to discharge the capacitor 375. As long as the second clock signal 306 stays at the LV, the gate node 379 of the transistor 360 stays at the HV and discharging of the capacitor 375 continues. Also, when the second clock signal 306 at the gate node 366 of the transistor 365 stays at the LV, the transistor 365 stays turned off an no current is suppled from the input voltage source 112 to the capacitor 375. In some embodiments, the second clock signal 306 stays at the LV until the capacitor 375 is completely discharged.

When the second clock signal 306 toggles to the HV, the output pulse 137 at the output node 138 goes to the HV and begins the duration $T_{on}$. The output of the AND gate 362 toggles to the HV. Because the capacitor 375 is discharged, the voltage of the node 372 and, thus, the voltage of the node 382 are at the LV and the voltage of the first input node 323 of the NAND gate 364 is at the HV. Thus, the output node 319 of the NAND gate 364 and the gate node 379 of the transistor 360 are set to the LV, which causes the transistor 360 to turn off and the discharging of the capacitor 375 stops. At the same time, because the second clock signal 306 toggles to the HV, the transistor 365 is turned on and the capacitor 375 is charged again by the input voltage source 112.

When the capacitor 375 is charging, the voltage of the node 372 goes up to the HV. Then the voltage of the node 382 is at the HV and the voltage of the reset node 313 of the DFF 358 is at the LV, which cause the output pulse 137 at the output node 138 toggles to the LV, which ends the duration $T_{on}$, while the second clock signal 306 is at the HV. After the duration $T_{on}$ ends, the off-time $T_{off}$ begins. At the same time, the output node of the NOT gate 335C toggles to the LV after a delay $T_d$ that is incorporated in the NOT gate 335C in some embodiments. After the first input node 323 of the NAND gate 364 goes to the LV, the output node 319 of the NAND gate 364 and the gate node 379 of the transistor 360 toggle to the HV and the transistor 360 turns on to discharge the capacitor 375 again. Thus, the duration $T_{on}$ depends on the time constant of the capacitor 375 and the resistor 370 and also inversely depends on the voltage of input voltage source 112.

When the capacitor 375 is discharging, while the second clock signal 306 is at the HV, the voltage of the node 372, the input node of the NOT gate 335A drops to the LV. The voltage of the node 382 goes to the LV and the voltage of the node 381 and the clock node 384 of the DFF 356 toggles to the HV. By toggling the clock node 384 from the LV to the HV, the inverted output node 337 of the DFF 356 toggles to the LV. Thus, the voltage of the second input node 321 of the NAND gate 364 toggles to the LV and the output node 319 of the NAND gate 364 and the gate node 379 of the transistor 360 is kept at the HV and the discharging of the capacitor 375 continues. As discussed above, when the second clock signal 306 toggles to the LV, the discharging of the capacitor 375 continues and the output pulse 137 at the output node 138 stays at the LV and the off-time $T_{off}$ continues until the second clock signal 306 toggles to the HV. Therefore, in some embodiments, the output pulse 137 is a periodic signal with the same period as the second clock signal 306, while $T_{on}$ is shorter than the duration of time the second clock signal 306 is at the HV and $T_{off}$ longer than the duration of time the second clock signal 306 is at the LV. Thus, the off-time $T_{off}$ is larger than the time the second clock signal 306 toggles to the LV and the switching frequency of the controller 102 of FIGS. 3A, 3B, and 3D, is the same as the frequency of the second clock signal 306.

Figure 4:
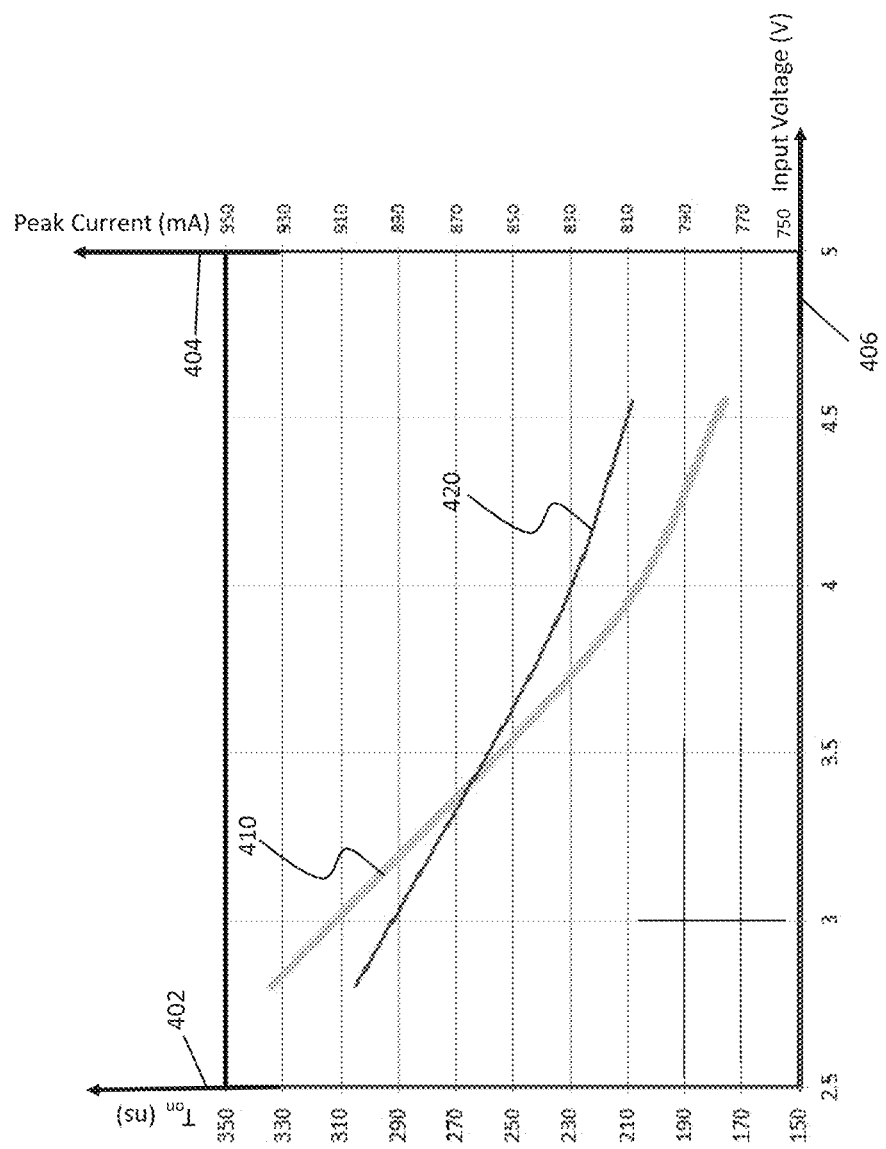
FIG. 4 illustrates graphs of the duration $T_{on}$ versus the input voltage and peak current versus the input voltage during the standby mode, according to various aspects of the subject technology.

FIG. 4 illustrates a graph 410 of duration $T_{on}$ versus the input voltage 256 and a graph 420 of peak current versus the input voltage during the standby mode, according to various aspects of the subject technology. The input voltage that changes between 2.5 volts and 5 volts is shown on a coordinate 406. The duration $T_{on}$ of FIG. 2B is shown on a coordinate 402 in nano seconds (ns) and the peak current is shown on a coordinate 404 in milli amperes (mA). As shown, the duration $T_{on}$ is essentially inversely proportional to the input voltage and as the input voltage on the coordinate 406 increases, the duration $T_{on}$ almost linearly decreases. Also, as shown by the graph 420, when the input voltage is increased by about two times, the peak current changes by about 12 percent and, thus, the peak current is not very sensitive to the input current. The graphs 410 and 420 are generated when the controller 102 of FIGS. 3A, 3B, and 3D is used in the switching-mode power supply 100 of FIG. 1 and the peak current is the maximum of the current 113 of the inductor 108 of FIG. 1. In some embodiments, the inductor 108 has a value of 1 micro Henry (uH). As shown in the graph 420 of FIG. 4, the peak current is at least twice less than the 1.4 Amperes of the inductor saturation current.

Figure 5:
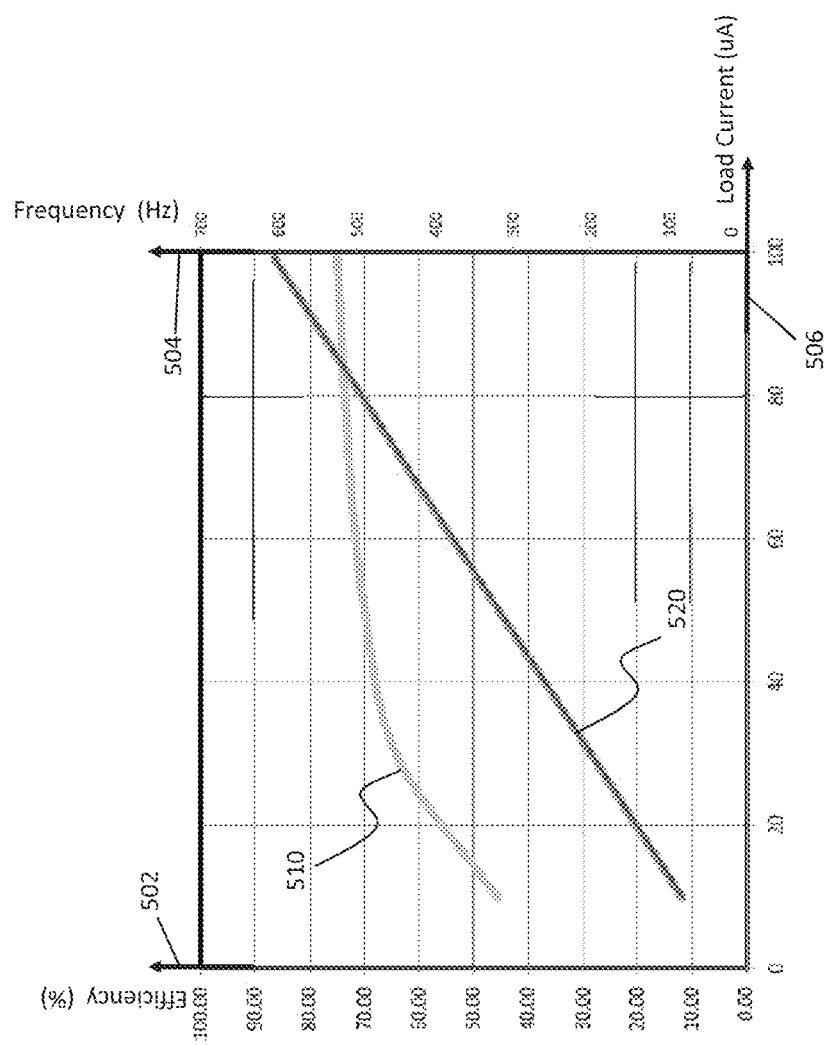
FIG. 5 illustrates graphs of efficiency versus load current and switching frequency of the controller versus load current, according to various aspects of the subject technology.

FIG. 5 illustrates a graph 510 of efficiency versus load current and a graph 520 of switching frequency of the controller versus the load current, according to various aspects of the subject technology. As shown in FIG. 1, if a load, e.g., a resistor, is attached between the first node 132 of the inductor 108 and the ground 110 and the voltage Vout is applied between the two ends of the load and a current, e.g., a load current passes through the load to the ground 110. The graph 510 shows the efficiency of a power supply in standby mode when uses the controller 102 of FIGS. 3A, 3B, and 3D. The efficiency is shown on a coordinate 502 versus a load current on a coordinate 506 in micro amperes (uA). As shown the efficiency is above 50 percent and increases as the load current increases. The graph 520 shows the switching frequency of a power supply in standby mode when uses the controller 102 of FIG. 3A. The switching frequency is shown on a coordinate 504 versus a load current in micro amperes (uA) on the coordinate 506. As shown the switching frequency linearly increases as the load current increases by a slope of about 5.9 Hz per micro amperes. Although not shown, the switching frequency is limited by the maximum switching frequency setting, when the load current increases beyond the limit shown in FIG. 5. As shown in the graph 520, the efficiency is more than 45% for the load current of 10 uA and the efficiency is more than 75% for the current load of 100 uA.

The subject technology discussed above produces controllers of the SMPS are designed such that the current of the SMPS does not exceed the rating and does not damage the inductor. Thus, the protection circuitry of the SMPS that is used during the active mode can be turned off to conserve power. In addition, a limit is set for the switching frequency and the duration $T_{on}$. Thus, the duration $T_{on}$ and predetermined max switching frequency limitation will guarantee that the SMPS operates in discontinuous conduction mode (DCM). Therefore, boost power stage can be configured as asynchronous switching to completely shut off the high-side gate drive system to save power.

According to aspects of the subject technology, a controller includes a first circuit to receive first and second input signals and generate an output pulse based on the first and second input signals. The controller includes a timer circuit to generate the first input signal for the first circuit and a second circuit to generate the second input signal for the first circuit. In response to the second input signal being set to a first value, smaller than a second value, the first circuit is sets the output pulse to the second value and starts a first duration. In response to the second input signal being set to the second value and the first input signal changing from the first value to the second value, the first circuit sets the output pulse to the first value to end the first duration and starts a second duration, and the second duration is maintained more than a predetermined time limit.

In an aspect of the subject technology, the output pulse repeats with a switching frequency that has a period equal to a sum of the first duration and the second duration, and the switching frequency is maintained below a predetermined frequency limit. In an aspect of the subject technology, the timer circuit has a timeout period and the timer circuit receives a trigger signal. In response to the trigger signal changing from the first value to the second value, the timer circuit starts. In response to starting the timer circuit, the timer circuit sets the first input signal of the first circuit to the first value and in response to starting the timer circuit and after the timeout period, the timer circuit changes the first input signal of the first circuit from the first value to the second value. In an aspect of the subject technology, the controller further a voltage source coupled to the timer circuit and the timeout period is inversely proportional to a voltage value of the voltage source. In an aspect of the subject technology, the timer circuit receives the output pulse as the trigger signal. In an aspect of the subject technology, the first circuit includes a D flip flop (DFF) with an input node of the DFF coupled to logical one. A clock node of the DFF receives the first input signal and a reset node of the DFF receives the second input signal. In an aspect of the subject technology, the second circuit receives a third input signal. In response to the third input signal being set to the first value, the second input signal for the first circuit is set to the second value, and in response to the third input signal being set to the first value, the second input signal for the first circuit is set to the first value.

According to aspects of the subject technology, a power supply includes a comparator coupled to a first voltage source and a second voltage source to generate a comparison signal based on a difference between a first voltage value of the first voltage source and a second voltage value of the second voltage source. The power supply includes a controller to generate a controller output pulse. The controller includes a first circuit to receive a first input signal and a second input signal and generate the controller output pulse based on the first input signal and the second input signal. The controller also includes a second circuit including first and second timer circuits having first and second timeout periods respectively. The first timer circuit is generates the first input signal for the first circuit, and the second timer circuit receives the comparison signal and to generate the second input signal for the first circuit. In response to the second input signal being set to a first value, smaller than a second value, the first circuit is sets the controller output pulse to the second value and starts a first duration and ends a second duration. In response to the comparison signal being set to the second value, the second timer circuit starts and the second input signal of the first circuit is set to the first value. The first and second timeout periods are determined to maintain the second duration more than a predetermined time limit.

In an aspect of the subject technology, in response to the second input signal being set to the second value and the first input signal changing from the first value to the second value, the first circuit sets the controller output pulse to the first value to end the first duration and start the second duration. In an aspect of the subject technology, the second circuit of the controller further includes first and second NOR gates with an output of each NOR gate coupled to an input of another NOR gate. The comparator is coupled to the first NOR gate and the second timer circuit is coupled to the second NOR gate. In an aspect of the subject technology, the power supply further includes an inductor, an input voltage source coupled between a ground and a first end of the inductor, and a transistor that includes a gate node, a source node, and a drain node and is coupled between a second end, opposite to the first end, of the inductor and the ground. The second end of the inductor is coupled to the source node of the transistor and the drain node of the transistor is coupled to the ground. The controller is coupled to the gate node of the transistor to provide the controller output pulse at the gate node of the transistor. The power supply further includes an output capacitor coupled to the ground from a first end of the output capacitor and a diode coupled between the second end of the inductor and a second end, opposite to the first end, of the output capacitor to charge the output capacitor by a current of the inductor and to prevent a capacitor discharge through the diode to provide the second voltage source. The controller is coupled to the gate node of the transistor to provide the controller output pulse at the gate node of the transistor. In an aspect of the subject technology, 12 the power supply further includes a load coupled to the second voltage source. The output capacitor is periodically charged for a duration $T_{on}$ and discharged for a duration $T_{off}$. The comparison signal is a periodic pulse with a period T that is greater than the duration $T_{off}$. The duration $T_{off}$ has a lower limit, and the controller output pulse is periodic with a predetermined upper frequency limit. In an aspect of the subject technology, in response to the duration $T_{off}$ having the lower limit, the current of the inductor becomes zero at an end of the duration $T_{off}$. The input voltage source is coupled to the first timer circuit of the controller, and the first timeout period is inversely proportional to a voltage of the input voltage source. In an aspect of the subject technology, the lower limit of the duration $T_{off}$ is determined to prevent over-current in the inductor.

According to aspects of the subject technology, a controller includes an input circuit to receive a comparison signal and a first clock signal and to generate an intermediate clock signal and a second clock signal. The first clock signal has a first frequency that is a predetermined number of times greater than an intermediate frequency of the intermediate clock signal. The second clock signal is provided at an output of the input circuit with a second frequency that is half of the intermediate frequency, and the second clock signal is set to a first value in response to the comparison signal being a second value, greater than the first value, and the comparison signal being the first value. The controller also includes an output circuit to receive an input voltage and the second clock signal and to generate an output pulse. The output pulse is a periodic pulse that is set to the second value in response to the second clock signal goes from the first value to the second value. The output circuit keeps the output pulse at the second value for a duration of time that is inversely proportional to the input voltage and a frequency of the output pulse is a same as the second frequency of the second clock signal.

In an aspect of the subject technology, the output circuit further includes an RC circuit that includes a first transistor. RC circuit also includes a resistor connected between the input voltage and a source of the first transistor. The second clock signal is coupled to a gate of the first transistor. The RC circuit further includes a capacitor coupled between a drain of the first transistor and a ground. In response to the second clock signal reaching the second value, the first transistor turns on and causes the input voltage to generate a current to charge the capacitor. In response to the capacitor charging to the second value, the output pulse is set to the first value. In an aspect of the subject technology, the output circuit further includes a second transistor that includes a second gate node, a second source node, and a second drain node. The second transistor is coupled between the first end and the second end of the capacitor. In response to the second clock signal reaching the second value, the first transistor turns on and charges the capacitor. In response to the second clock signal reaching the first value, the second transistor turns on and discharges the capacitor. The second transistor stays on and the output pulse stays at the first value in response to the second clock signal being at the first value. In an aspect of the subject technology, the output circuit further includes a D flip flop (DFF) to generate the output pulse at an output node of the DFF. The second clock signal is coupled to a clock node of the DFF. In an aspect of the subject technology, the input circuit further includes first and second DFF. The comparison signal that passes through the first and second DFFs, in response to the first clock signal of the first and second DFFs, is synchronized with the first clock signal. The comparison signal is an indication of a comparison of two voltages coupled to two input nodes of the comparator. In an aspect of the subject technology, the input circuit further includes a divider module to receive the first clock signal and to generate the intermediate clock signal such that the predetermined number is an integer between 2 and 10.

Those of skill in the art would appreciate that the various illustrative blocks, modules, elements, components, memory systems, and algorithms described herein may be implemented as electronic hardware, computer software, or combinations of both. To illustrate this interchangeability of hardware and software, various illustrative blocks, modules, elements, components, memory systems, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks should be performed. Any of the blocks may be simultaneously performed. In one or more implementations, multitasking and parallel processing may be advantageous. Moreover, the separation of various system components in the embodiments described above should not be understood as requiring such separation in all embodiments, and it should be understood that the described program components and systems could generally be integrated together in a single software product or packaged into multiple software products.

As used in this specification and any claims of this application, the terms "base station," "receiver," "computer," "server," "processor," and "memory" all refer to electronic or other technological devices. These terms exclude people or groups of people. For the purposes of the specification, the term "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" and "at least one of A, B, or C" each refer to only A, only B, or only C; any combination of A, B, and C; and/or at least one of each of A, B, and C.

The predicate words "configured to," "operable to," and "programmed to" do not imply any particular tangible or intangible modification of a subject but rather are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as "an aspect," "the aspect," "another aspect," "some aspects," "one or more aspects," "an implementation," "the implementation," "another implementation," "some implementations," "one or more implementations," "an embodiment," "the embodiment," "another embodiment," "some embodiments," "one or more embodiments," "a configuration," "the configuration," "another configuration," "some configurations," "one or more configurations," "the subject technology," "the disclosure," "the present disclosure," and other variations thereof and alike are for convenience and do not imply that a disclosure relating to such phrase(s) is essential to the subject technology or that such disclosure applies to all configurations of the subject technology. A disclosure relating to such phrase (s) may apply to all configurations, or one or more configurations. A disclosure relating to such phrase(s) may provide one or more examples. A phrase such as "an aspect" or "some aspects" may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skilled in the art are expressly incorporated herein by reference and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112(f) unless the element is expressly recited using the phrase "means for" or, in the case of a memory system claim, the element is recited using the phrase "step for."

The previous description is provided to enable any person skilled in the art to practice the various aspects described herein. Various modifications to these aspects would be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A controller, comprising:
a first circuit configured to receive first and second input signals and generate an output pulse based on the first and second input signals;
a timer circuit configured to generate the first input signal for the first circuit; and
a second circuit configured to generate the second input signal for the first circuit, wherein:
in response to the second input signal being set to a first value, smaller than a second value, the first circuit is configured to set the output pulse to the second value and start a first duration,
in response to the second input signal being set to the second value and the first input signal changing from the first value to the second value, the first circuit is configured to set the output pulse to the first value to end the first duration and start a second duration, and
the second duration is maintained more than a predetermined time limit.

2. The controller of claim 1, wherein the output pulse repeats with a switching frequency that has a period equal to a sum of the first duration and the second duration, and wherein the switching frequency is maintained below a predetermined frequency limit.

3. The controller of claim 1, wherein the timer circuit has a timeout period, and wherein:
the timer circuit is configured to receive a trigger signal;
in response to the trigger signal changing from the first value to the second value, the timer circuit starts;
in response to starting the timer circuit, the timer circuit is configured to set the first input signal of the first circuit to the first value; and
in response to starting the timer circuit and after the timeout period, the timer circuit is configured to change the first input signal of the first circuit from the first value to the second value.

4. The controller of claim 3, further comprising:
a voltage source coupled to the timer circuit, wherein the timeout period is inversely proportional to a voltage value of the voltage source, and wherein the first duration is inversely proportional to the voltage value of the voltage source.

5. The controller of claim 3, wherein the timer circuit is configured to receive the output pulse as the trigger signal.

6. The controller of claim 1, wherein the first circuit comprises a D flip flop (DFF) with an input node of the DFF coupled to logical one, wherein a clock node of the DFF is configured to receive the first input signal, and a reset node of the DFF is configured to receive the second input signal.

7. The controller of claim 1, wherein the second circuit is configured to receive a third input signal, wherein in response to the third input signal being set to the first value, the second input signal for the first circuit is set to the second value, and wherein in response to the third input signal being set to the first value, the second input signal for the first circuit is set to the first value.

8. A power supply, comprising:
a comparator coupled to a first voltage source and a second voltage source to generate a comparison signal based on a difference between a first voltage value of the first voltage source and a second voltage value of the second voltage source; and
a controller configured to generate a controller output pulse, wherein the controller comprises:
a first circuit configured to receive a first input signal and a second input signal and generate the controller output pulse based on the first input signal and the second input signal; and
a second circuit comprising first and second timer circuits having first and second timeout periods respectively, wherein the first timer circuit is configured to generate the first input signal for the first circuit, wherein the second timer circuit is configured to receive the comparison signal and to generate the second input signal for the first circuit, and wherein:
in response to the second input signal being set to a first value, smaller than a second value, the first circuit is configured to set the controller output pulse to the second value and start a first duration and end a second duration,
in response to the comparison signal being set to the second value, the second timer circuit starts and the second input signal of the first circuit is set to the first value, and
the first and second timeout periods are determined to maintain the second duration more than a predetermined time limit.

9. The power supply of claim 8, wherein in response to the second input signal being set to the second value and the first input signal changing from the first value to the second value, the first circuit is configured to set the controller output pulse to the first value to end the first duration and start the second duration.

10. The power supply of claim 8, wherein the second circuit of the controller further comprises first and second NOR gates with an output of each NOR gate coupled to an input of another NOR gate, wherein the comparator is coupled to the first NOR gate and the second timer circuit is coupled to the second NOR gate.

11. The power supply of claim 8, further comprising:
an inductor;
an input voltage source coupled between a ground and a first end of the inductor;
a transistor, that comprises a gate node, a source node, and a drain node, coupled between a second end, opposite to the first end, of the inductor and the ground, wherein the second end of the inductor is coupled to the source node of the transistor and the drain node of the transistor is coupled to the ground;
an output capacitor coupled to the ground from a first end of the output capacitor; and
a diode coupled between the second end of the inductor and a second end, opposite to the first end, of the output capacitor and configured to charge the output capacitor by a current of the inductor and prevent a capacitor discharge through the diode to provide the second voltage source, wherein the controller is coupled to the gate node of the transistor and is configured to provide the controller output pulse at the gate node of the transistor.

12. The power supply of claim 11, further comprising:
a load coupled to the second voltage source, wherein the output capacitor is periodically charged for a duration $T_{on}$ and discharged for a duration $T_{off}$, wherein the comparison signal is a periodic pulse with a period T that is greater than the duration $T_{off}$, wherein the duration $T_{off}$ has a lower limit, and wherein the controller output pulse is periodic with a predetermined upper frequency limit.

13. The power supply of claim 12, wherein in response to the duration $T_{off}$ having the lower limit, the current of the inductor is configured to become zero at an end of the duration $T_{off}$, wherein the input voltage source is coupled to the first timer circuit of the controller, and wherein the first timeout period is inversely proportional to a voltage of the input voltage source.

14. The power supply of claim 12, wherein the lower limit of the duration $T_{off}$ is determined to prevent over-current in the inductor.

15. A controller comprising:
an input circuit configured to receive a comparison signal and a first clock signal and generate an intermediate clock signal and a second clock signal, wherein the first clock signal has a first frequency that is a predetermined number of times greater than an intermediate frequency of the intermediate clock signal, wherein the second clock signal is provided at an output of the input circuit with a second frequency that is half of the intermediate frequency, and wherein the second clock signal is set to a first value in response to the comparison signal being at a second value, greater than the first value, and the comparison signal being the first value; and
an output circuit configured to receive an input voltage and the second clock signal and generate an output pulse, wherein the output pulse is a periodic pulse that is set to the second value in response to the second clock signal being set from the first value to the second value, wherein the output circuit is configured to keep the output pulse at the second value for a duration of time that is inversely proportional to the input voltage, and wherein a frequency of the output pulse is a same as the second frequency of the second clock signal.

16. The controller of claim 15, wherein the output circuit further comprises:
an RC circuit comprising:
a first transistor;
a resistor connected between the input voltage and a source of the first transistor,
wherein the second clock signal is coupled to a gate of the first transistor; and
a capacitor coupled between a drain of the first transistor and a ground, wherein in response to the second clock signal reaching the second value, the first transistor is configured to turn on and cause the input voltage to generate a current to charge the capacitor, wherein in response to the capacitor charging to the second value, the output pulse is set to the first value.

17. The controller of claim 16, wherein the output circuit further comprises:
a second transistor comprising a second gate node, a second source node, and a second drain node, wherein the second transistor is coupled between a first end and a second end of the capacitor, wherein in response to the second clock signal reaching the second value, the first transistor is configured to turn on and charge the capacitor, wherein in response to the second clock signal reaching the first value, the second transistor is configured to turn on and discharge the capacitor, and wherein the second transistor is configured to stay on and the output pulse to stay at the first value in response to the second clock signal being at the first value.

18. The controller of claim 15, wherein the output circuit further comprises:
a D flip flop (DFF) configured to generate the output pulse at an output node of the DFF, wherein the second clock signal is coupled to a clock node of the DFF.

19. The controller of claim 15, wherein the input circuit further comprises:
first and second DFF, wherein the comparison signal that passes through the first and second DFFs, in response to the first clock signal of the first and second DFFs, is synchronized with the first clock signal, and wherein the comparison signal is an indication of a comparison of two voltages coupled to two input nodes of the comparator.

20. The controller of claim 15, wherein the input circuit further comprises:
a divider module configured to receive the first clock signal and generate the intermediate clock signal, wherein the predetermined number is an integer between 2 and 10.

* * * * *